(12) United States Patent
Shibuta

(10) Patent No.: US 10,276,615 B2
(45) Date of Patent: Apr. 30, 2019

(54) SOLID-STATE IMAGING DEVICE, METHOD OF MANUFACTURING THE SAME, AND ELECTRONIC APPARATUS

(71) Applicant: SONY CORPORATION, Tokyo (JP)

(72) Inventor: Hirokazu Shibuta, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/910,225

(22) PCT Filed: May 29, 2015

(86) PCT No.: PCT/JP2015/065537
§ 371 (c)(1),
(2) Date: Feb. 4, 2016

(87) PCT Pub. No.: WO2015/190321
PCT Pub. Date: Dec. 17, 2015

(65) Prior Publication Data
US 2017/0084655 A1   Mar. 23, 2017

(30) Foreign Application Priority Data
Jun. 12, 2014 (JP) .................................. 2014-121290

(51) Int. Cl.
*H01L 27/146* (2006.01)
*H04N 5/225* (2006.01)
(Continued)

(52) U.S. Cl.
CPC .......... *H01L 27/14627* (2013.01); *G02B 3/00* (2013.01); *G02B 3/0075* (2013.01);
(Continued)

(58) Field of Classification Search
CPC ......... H01L 27/14627; H01L 27/14685; H01L 27/14; G02B 3/0075; G02B 3/00; H04N 5/2254; H04N 5/369
(Continued)

(56) References Cited

U.S. PATENT DOCUMENTS 9,515,114 B2\* 12/2016 Ootsuka ............ H04N 5/23212
2008/0080028 A1\* 4/2008 Bakin .................. G06T 1/0007
358/514

(Continued)

FOREIGN PATENT DOCUMENTS

JP    4-233759 A    8/1992
JP    6-140611 A    5/1994
(Continued)

*Primary Examiner* — Marc Anthony Armand
(74) *Attorney, Agent, or Firm* — Sheridan Ross P.C.

(57) ABSTRACT

The present technology relates to a solid-state imaging device that can improve the sensitivity of imaging pixels while maintaining AF properties of a focus detecting pixel. The present technology also relates to a method of manufacturing the solid-state imaging device, and an electronic apparatus.

The solid-state imaging device includes: a pixel array unit including pixels; first microlenses formed in the respective pixels; a film formed to cover the first microlenses of the respective pixels; and a second microlens formed on the film of the focus detecting pixel among the pixels. The present technology can be applied to CMOS image sensors, for example.

19 Claims, 9 Drawing Sheets

(51) Int. Cl.
  *G02B 3/00* (2006.01)
  *H01L 27/14* (2006.01)
  *H04N 5/369* (2011.01)
(52) U.S. Cl.
  CPC ........ *H01L 27/14* (2013.01); *H01L 27/14685* (2013.01); *H04N 5/2254* (2013.01); *H04N 5/369* (2013.01)
(58) Field of Classification Search
  USPC ....................................................... 257/432
  See application file for complete search history.

(56) References Cited

U.S. PATENT DOCUMENTS

| | | |
|---|---|---|
| 2008/0278820 A1 | 11/2008 | Li et al. |
| 2009/0008687 A1* | 1/2009 | Katsuno ............ H01L 27/14636 257/292 |
| 2011/0076001 A1* | 3/2011 | Iwasaki ................. G03B 7/099 396/114 |
| 2012/0043634 A1* | 2/2012 | Kurihara .............. G02B 3/0018 257/432 |
| 2012/0188421 A1 | 7/2012 | Boettiger |
| 2012/0194696 A1* | 8/2012 | Ohshitanai ........ H01L 27/14625 348/222.1 |
| 2015/0281538 A1* | 10/2015 | Boettiger ............. H04N 5/2258 348/218.1 |

FOREIGN PATENT DOCUMENTS

| | | |
|---|---|---|
| JP | 2003-209230 A | 7/2003 |
| JP | 2007-242877 A | 9/2007 |
| JP | 2010-252277 | 9/2007 |
| JP | 2007-281296 | 10/2007 |
| JP | 2013-12506 A | 1/2013 |
| JP | 2013-021168 | 1/2013 |
| JP | 2013-172292 A | 9/2013 |
| JP | 2014-86471 A | 5/2014 |
| JP | 2014-89432 A | 5/2014 |

* cited by examiner

SOLID-STATE IMAGING DEVICE, METHOD
OF MANUFACTURING THE SAME, AND
ELECTRONIC APPARATUS

CROSS REFERENCE TO RELATED APPLICATIONS

This application is a national stage application under 35 U.S.C. 371 and claims the benefit of PCT Application No. PCT/JP2015/065537 having an international filing date of 29 May 2015, which designated the United States, which PCT application claimed the benefit of Japanese Patent Application No. 2014-121290 filed 12 Jun. 2014, the disclosures of which are incorporated herein by reference in their entirety.

TECHNICAL FIELD

The present technology relates to a solid-state imaging device, a method of manufacturing the solid-state imaging device, and an electronic apparatus. Particularly, the present technology relates to a solid-state imaging device that can improve the sensitivity of imaging pixels, a method of manufacturing the solid-state imaging device, and an electronic apparatus.

BACKGROUND ART

In recent years, there have been solid-state imaging devices that have focus detecting pixels as well as imaging pixels in the pixel array unit, and detect a focal point based on a shift amount between signals output from a pair of focus detecting pixels, or conduct focus detection of a so-called imaging-plane phase difference AF (Auto Focus) type.

Among such solid-state imaging devices, various techniques have been suggested so as to optimize the respective sensitivities of the imaging pixels and the focus detecting pixels.

For example, a solid-state imaging device in which one microlens is placed to cover more than one focus detecting pixel has been suggested (see Patent Document 1, for example).

Also, a solid-state imaging device in which the microlenses of imaging pixels and focus detecting pixels having different refractive indexes are formed in the same layer has been suggested (see Patent Document 2, for example).

Further, a solid-state imaging device in which in-layer lenses are provided only for the focus detecting pixels has been suggested (see Patent Document 3, for example).

CITATION LIST

Patent Documents

Patent Document 1: Japanese Patent Application Laid-Open No. 2010-252277
Patent Document 2: Japanese Patent Application Laid-Open No. 2013-21168
Patent Document 3: Japanese Patent Application Laid-Open No. 2007-281296

SUMMARY OF THE INVENTION

Problems to be Solved by the Invention

In the solid-state imaging devices disclosed in Patent Documents 1 and 2, however, microlenses having a different curvature and a different refractive index from those of the microlenses of the other imaging pixels need to be formed on the same plane. Therefore, through the lithographic process at the time of the formation of microlenses, the shapes of the microlenses vary between the imaging pixels adjacent to the focus detecting pixels and the imaging pixels not adjacent to the focus detecting pixels due to pattern discontinuities, and a sensitivity difference might be caused among the imaging pixels.

Also, in the solid-state imaging device disclosed in Patent Document 3, the in-layer lenses provided in the focus detecting pixels cause increases in the distances between the microlenses on the layer and the light receiving surface. As a result, all the pixels become taller. This might result in degradation of the sensitivity of the imaging pixels or occurrences of color mixing.

The present technology has been developed in view of those circumstances, and aims to improve the sensitivity of the imaging pixels while maintaining the AF properties of the focus detecting pixel.

Solutions to Problems

A solid-state imaging device of one aspect of the present technology includes: a pixel array unit including pixels; first microlenses formed in the respective pixels; a film formed to cover the first microlenses of the respective pixels; and a second microlens formed on the film of a focus detecting pixel among the pixels.

The film may be formed as an etching stopper film that prevents etching on the first microlenses of the pixels other than the focus detecting pixel when the second microlens is formed.

The film may have a refractive index of approximately 1.4 to 2.0.

The film may be formed with SiO, SiN, or SiON.

The second microlens may be formed so as to be shared by the focus detecting pixels adjacent to each other.

The second microlens may have a higher refractive index than the refractive index of the first microlenses.

The first microlenses of the respective pixels may be formed in the same layer.

A method of manufacturing a solid-state imaging device of one aspect of the present technology is a method of manufacturing a solid-state imaging device including a pixel array unit having pixels,
the method including: forming first microlenses in the respective pixels; forming a film to cover the first microlenses of the respective pixels; and forming a second microlens on the film of a focus detecting pixel among the pixels.

An electronic apparatus of one aspect of the present technology includes a solid-state imaging device including: a pixel array unit having pixels; first microlenses formed in the respective pixels; a film formed to cover the first microlenses of the respective pixels; and a second microlens formed on the film of a focus detecting pixel among the pixels.

In one aspect of the present technology, first microlenses are formed in the respective pixels, a film is formed to cover the first microlenses of the respective pixels, and a second microlens is formed on the film of the focus detecting pixel among the pixels.

Effects of the Invention

According to one aspect of the present technology, the sensitivity of the imaging pixels can be improved while the AF properties of the focus detecting pixel are maintained.

MODES FOR CARRYING OUT THE INVENTION

The following is a description of embodiments of the present technology, with reference to the drawings.

<Example Structure of a Solid-State Imaging Device>

Figure 1:
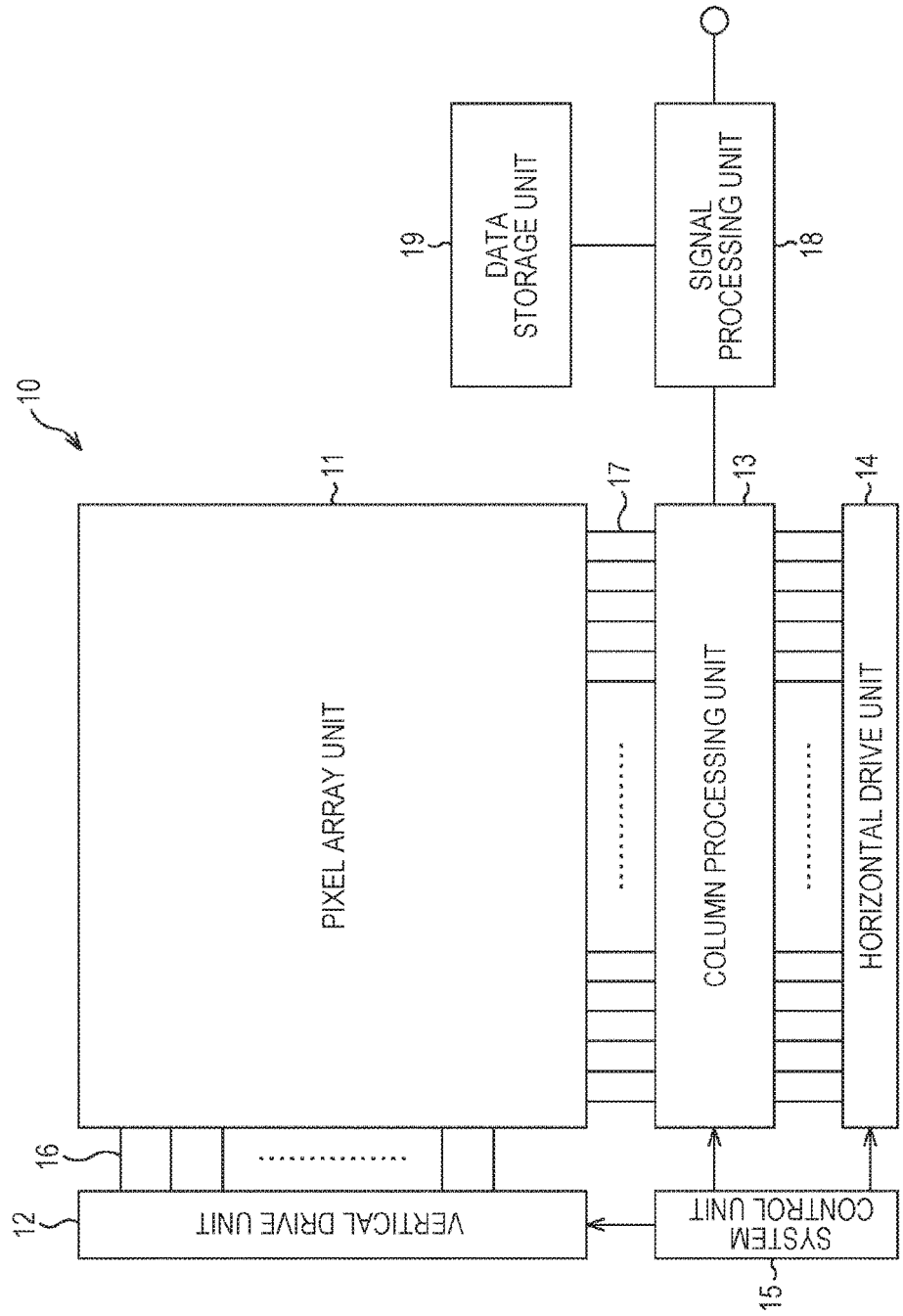
FIG. 1 is a block diagram showing an example structure of a solid-state imaging device to which the present technology is applied.

FIG. 1 is a block diagram showing an embodiment of a solid-state imaging device to which the present technology is applied. In the description below, the structure of a surface-illuminated CMOS (Complementary Metal Oxide Semiconductor) image sensor that is an amplification-type solid-state imaging device will be explained. It should be noted that the present technology is not limited to surface-illuminated CMOS image sensors, and can be applied to back-illuminated CMOS image sensors, other amplification-type solid-state imaging devices, and charge-transfer-type solid-state imaging devices such as CCD (Charge Coupled Device) image sensors.

The CMOS image sensor 10 shown in FIG. 1 includes a pixel array unit 11 formed on a semiconductor substrate that is not shown in the drawing, and a peripheral circuit unit integrated on the same semiconductor substrate as the pixel array unit 11. The peripheral circuit unit is formed with a vertical drive unit 12, a column processing unit 13, a horizontal drive unit 14, and a system control unit 15, for example.

The CMOS image sensor 10 further includes a signal processing unit 18 and a data storage unit 19.

The pixel array unit 11 has a structure in which unit pixels (hereinafter also referred to simply as pixels) are two-dimensionally arranged in the row direction and the column direction, or in a matrix fashion. The unit pixels each have a photoelectric conversion unit that generates and accumulates optical charges in accordance with the amount of received light. Here, the row direction means the array direction of the pixels in the pixel rows (the horizontal direction), and the column direction means the array direction of the pixels in the pixel columns (the vertical direction). The pixels in the pixel array unit 11 include pixels (imaging pixels) that generate signals for generating a captured image based on received object light, and a pixel (focus detecting pixel) that generates a signal for conducting focus detection.

In the matrix-like pixel array of the pixel array unit 11, pixel drive lines 16 are provided in the respective pixel rows, and vertical signal lines 17 are provided in the respective pixel columns. The pixel drive lines 16 transmit drive signals for performing driving when signals are read from the pixels. In FIG. 1, each pixel drive line 16 is shown as a single interconnect, but is not limited to a single interconnect. One end of each of the pixel drive lines 16 is connected to the output end of the vertical drive unit 12 corresponding to each row.

The vertical drive unit 12 is formed with a shift register, an address decoder, and the like, and drives the respective pixels in the pixel array unit 11 collectively or row by row. That is, the vertical drive unit 12, together with the system control unit 15 that controls the vertical drive unit 12, forms a drive unit that drives the respective pixels in the pixel array unit 11. The structure of the vertical drive unit 12 is not specifically shown in the drawing, but normally has a structure that includes two scanning systems: a read scanning system and a sweep scanning system.

To read signals from the unit pixels, the read scanning system sequentially selects and scans the unit pixels in the pixel array unit 11 row by row. The signals to be read from the unit pixels are analog signals. The sweep scanning system performs sweep scanning on the read row on which read scanning is to be performed by the read scanning system, prior to the read scanning by the time equivalent to the shutter speed.

Through the sweep scanning by this sweep scanning system, unnecessary charges are swept out of the photoelectric conversion units of the unit pixels of the read row, and thus, the photoelectric conversion units are reset. As the unnecessary charges are swept (reset) by the sweep scanning system, an electronic shutter operation is performed. Here, an electronic shutter operation is an operation to discard optical charges of the photoelectric conversion units, and newly start exposure (start accumulating optical charges).

The signals read through the reading operation performed by the read scanning system correspond to the amount of light received after the previous reading operation or electronic shutter operation. The period from the time of reading in the previous reading operation or the time of scanning in the previous electronic shutter operation to the time of reading in the current reading operation is the period of exposure of the optical charges at the unit pixels.

The signals output from the respective unit pixels of the pixel row selected and scanned by the vertical drive unit 12 are input to the column processing unit 13 through the respective vertical signal lines 17 of the pixel columns. For the respectively pixel columns of the pixel array unit 11, the column processing unit 13 performs predetermined signal processing on the signals output from the respective pixels of a selected row through the vertical signal lines 17, and temporarily holds the pixel signals subjected to the signal processing.

Specifically, the column processing unit 13 performs at least a denoising process such as a CDS (Correlated Double Sampling) process, as the signal processing. Through the CDS process performed by the column processing unit 13, reset noise and the fixed pattern noise unique to the pixels, such as a threshold variation among the amplifying transistors in the pixels, are removed. The column processing unit 13 may not only be made to perform the denoising process, but may also be made to have an AD (Analog-Digital) conversion function, for example, and convert analog pixel signals into digital signals to be output.

The horizontal drive unit 14 is formed with a shift register, an address decoder, and the like, and sequentially selects the unit circuits corresponding to the pixel columns of the column processing unit 13, for example. Through the selective scanning performed by the horizontal drive unit 14, the pixel signals subjected to the signal processing by the column processing unit 13 for the respective unit circuits are sequentially output.

The system control unit 15 includes a timing generator that generates various timing signals, and performs drive control on the vertical drive unit 12, the column processing unit 13, the horizontal drive unit 14, and the like based on the various timing signals generated by the timing generator.

The signal processing unit 18 has at least an arithmetic processing function, and performs various kinds of signal processing such as arithmetic processing on the pixel signals that are output from the column processing unit 13. The data storage unit 19 temporarily stores the data necessary for the signal processing to be performed by the signal processing unit 18.

The signal processing unit 18 and the data storage unit 19 may be mounted on the same substrate (semiconductor substrate) as the CMOS image sensor 10, or may be placed on a different substrate from the CMOS image sensor 10. Also, the respective processes to be performed by the signal processing unit 18 and the data storage unit 19 may be performed as processes to be performed by an external signal processing unit provided on a different substrate from the CMOS image sensor 10, such as a DSP (Digital Signal Processor) circuit or software.

In a case where the CMOS image sensor 10 is a back-illuminated CMOS image sensor, the CMOS image sensor 10 may be produced as a stacked CMOS image sensor formed by bonding a semiconductor substrate including the pixel array unit 11 and a semiconductor substrate including a logic circuit to each other.

Pixel Arrangement of the First Embodiment

Figure 2:
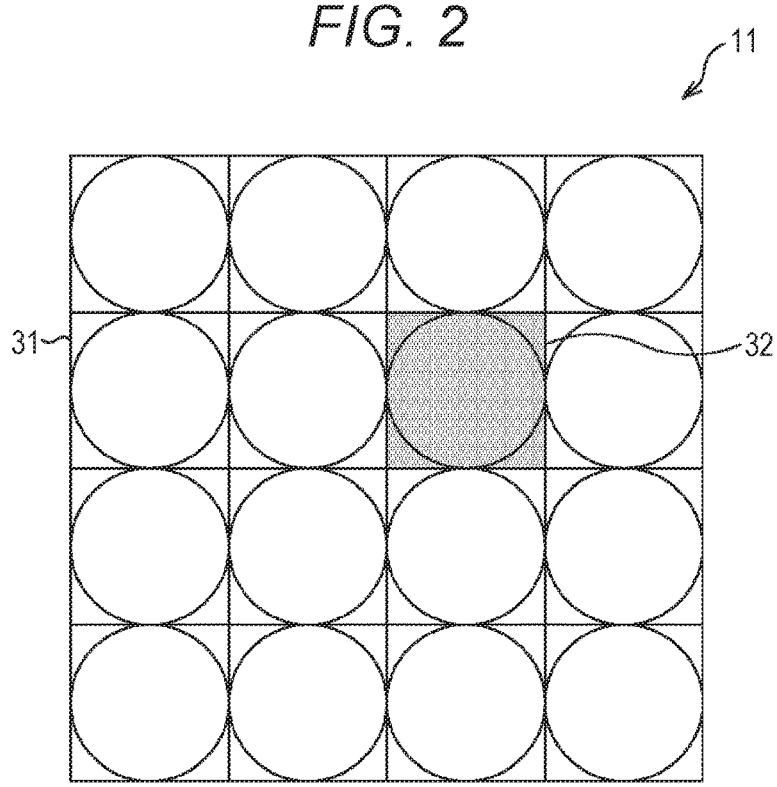
FIG. 2 is a diagram for explaining the pixel arrangement in a first embodiment of the present technology.

Referring now to FIG. 2, the pixel arrangement in the pixel array unit 11 of the first embodiment is described.

As shown in FIG. 2, in the pixel array unit 11, imaging pixels 31 represented by white squares are two-dimensionally arranged in a matrix fashion. The imaging pixels 31 are formed with R pixels, G pixels, and B pixels, and these pixels are regularly arranged in accordance with the Beyer pattern, for example.

In the pixel array unit 11, focus detecting pixels 32 each represented by a shaded square are scattered among the imaging pixels 31 two-dimensionally arranged in a matrix fashion. For example, some of the imaging pixels 31 in a predetermined row among the pixel rows in the pixel array unit 11 are replaced with focus detecting pixels 32, so that the focus detecting pixels 32 are regularly arranged in a specific pattern. It should be noted that the arrangement of the imaging pixels 31 and the focus detecting pixels 32 in the pixel array unit 11 is not limited to the above, and may have some other pattern.

Next, an example configuration of the imaging pixels 31 and the focus detecting pixels 32 in the pixel array unit 11 is described.

Example Configuration of the Pixels of the First Embodiment

Figure 3:
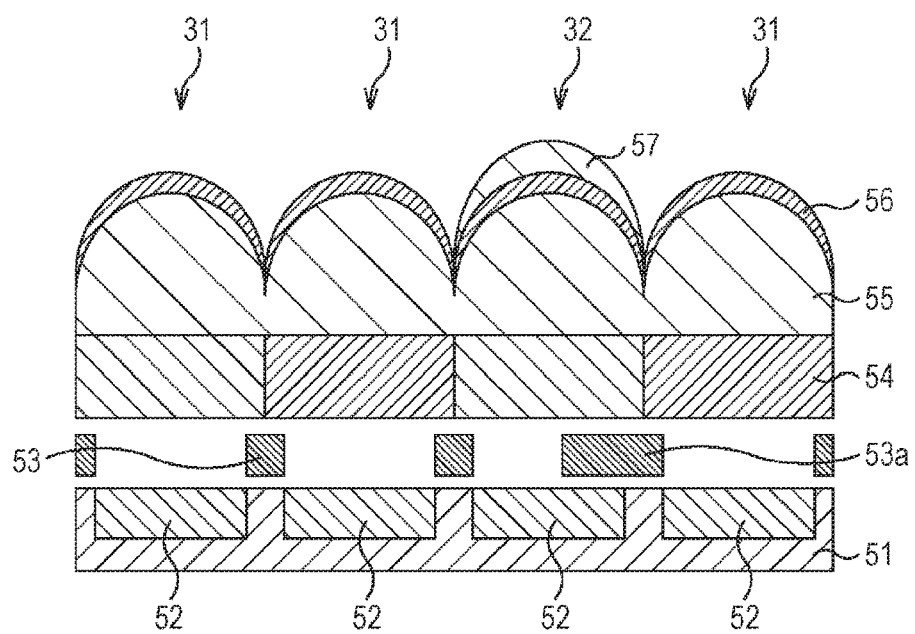
FIG. 3 is a cross-sectional view of an example configuration of pixels according to the first embodiment of the present technology.

FIG. 3 is a cross-sectional view of an example configuration of the pixels in the CMOS image sensor 10 of the first embodiment.

As shown in FIG. 3, in an imaging pixel 31, a photoelectric conversion unit 52 that receives incident light and performs photoelectric conversion is formed in a semiconductor substrate 51, and an interconnect layer 53 made of Cu, Al, W, or the like is formed on the upper layer of the semiconductor substrate 51.

On the interconnect layer 53, color filter layers 54 having spectral characteristics suitable for the respective imaging pixels 31 are formed for the respective imaging pixels 31, and microlenses 55 are formed on the color filter layers 54. The microlenses 55 each have a refractive index of approximately 1.5, and are made of a resin such as a styrene-acrylic copolymer.

In the focus detecting pixel 32, a semiconductor substrate 51, a photoelectric conversion unit 52, an interconnect layer 53, a color filter layer 54, and a microlens 55 are formed as in the imaging pixels 31. In the focus detecting pixel 32, part of the interconnect layer 53 is formed as a light shielding film 53a that shields part of light entering the photoelectric conversion unit 52. The light shielding film 53a is designed so that an opening of a size almost equal to a half the size of the light receiving area of the photoelectric conversion unit 52 is formed. In the focus detecting pixel 32, instead of the color filter layer 54, a dimming filter for reducing the amount of incident light to almost the same amount as that with the color filter layer 54 may be formed.

In the imaging pixels 31 and the focus detecting pixel 32, the microlenses 55 are formed in the same layer, and a film 56 is formed on the respective microlenses 55 so as to cover the microlenses 55 of the respective pixels. The film 56 has a refractive index of approximately 1.4 to 2.0, and is formed with SiO, SiN, SiON, or the like.

Further, in the focus detecting pixel 32, a microlens 57 is formed on the film 56. The microlens 57 also has a refractive index of approximately 1.5, and is made of a resin such as a styrene-acrylic copolymer.

In the imaging pixels 31 and the focus detecting pixel 32, the microlenses 55 and 57 are formed by performing dry etching on the lens material forming these microlenses. Here, the film 56 is formed as an etching stopper film for preventing etching on the microlenses 55 of the imaging pixels 31 when the microlens 57 is formed.

Also, in the imaging pixels 31 and the focus detecting pixel 32, the microlenses 55 are uniformly formed or are formed to have identical shapes and sizes, and have the same light collecting points. In the focus detecting pixel 32, however, the shape and the thickness of the microlens 57 are adjusted so as to precisely set a light collecting point.

That is, in the imaging pixels 31, the light collecting points can be set on the light receiving surfaces of the photoelectric conversion units 52 by the microlenses 55. In the focus detecting pixel 32, the light collecting point can be set on the upper surface of the light shielding film 53a by the microlenses 55 and 57.

In the configuration according to this embodiment, through the lithographic process at the time of the formation of the microlenses, the shapes of the microlenses 55 do not vary between the imaging pixels 31 adjacent to the focus detecting pixel 32 and the imaging pixels 31 not adjacent to the focus detecting pixel 32, and all the pixels do not become taller. While the light collecting points are set on the light receiving surfaces of the photoelectric conversion units 52 in the imaging pixels 31, the light collecting point is set on the upper surface of the light shielding film 53a in the focus detecting pixel 32. That is, while the AF properties of the focus detecting pixel are maintained, the sensitivity of the imaging pixels can be improved without any degradation in color mixing.

<Flow of Pixel Formation>

Figure 4:
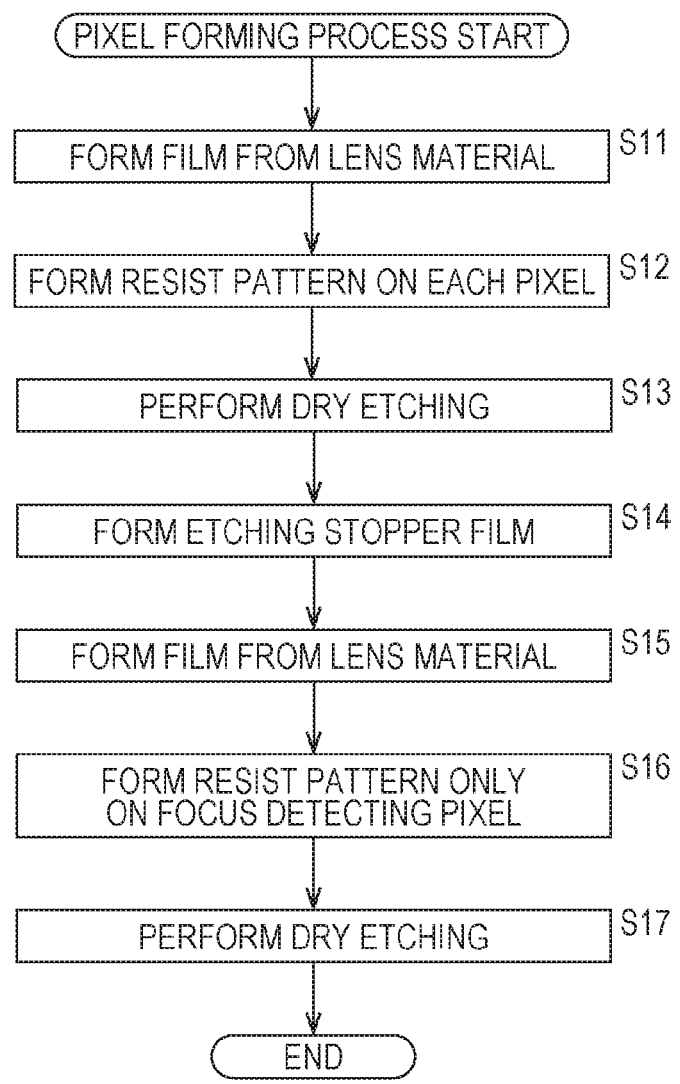
FIG. 4 is a flowchart for explaining a pixel forming process.
Figure 5:
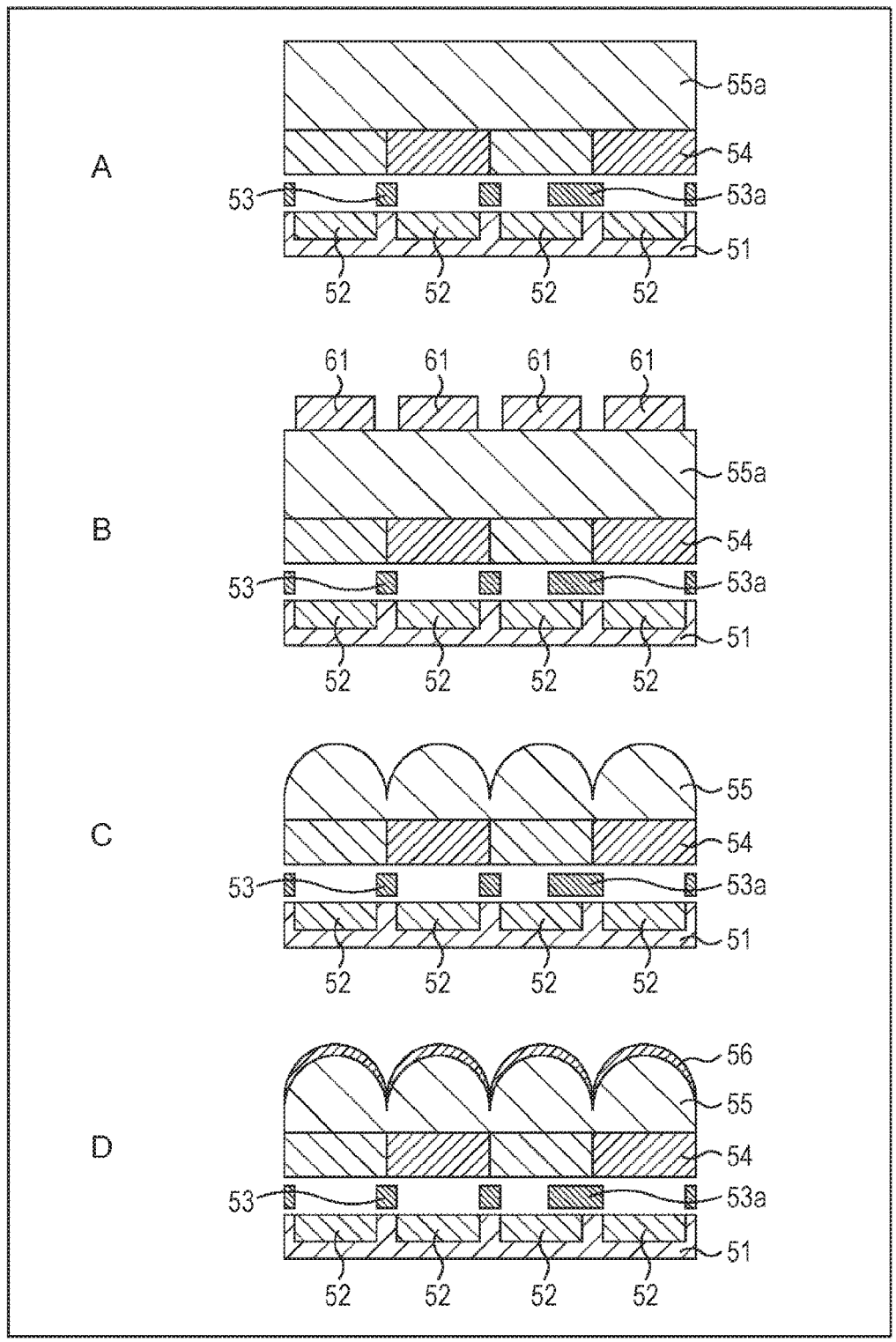
FIG. 5 is a diagram for explaining the steps in pixel formation.
Figure 6:
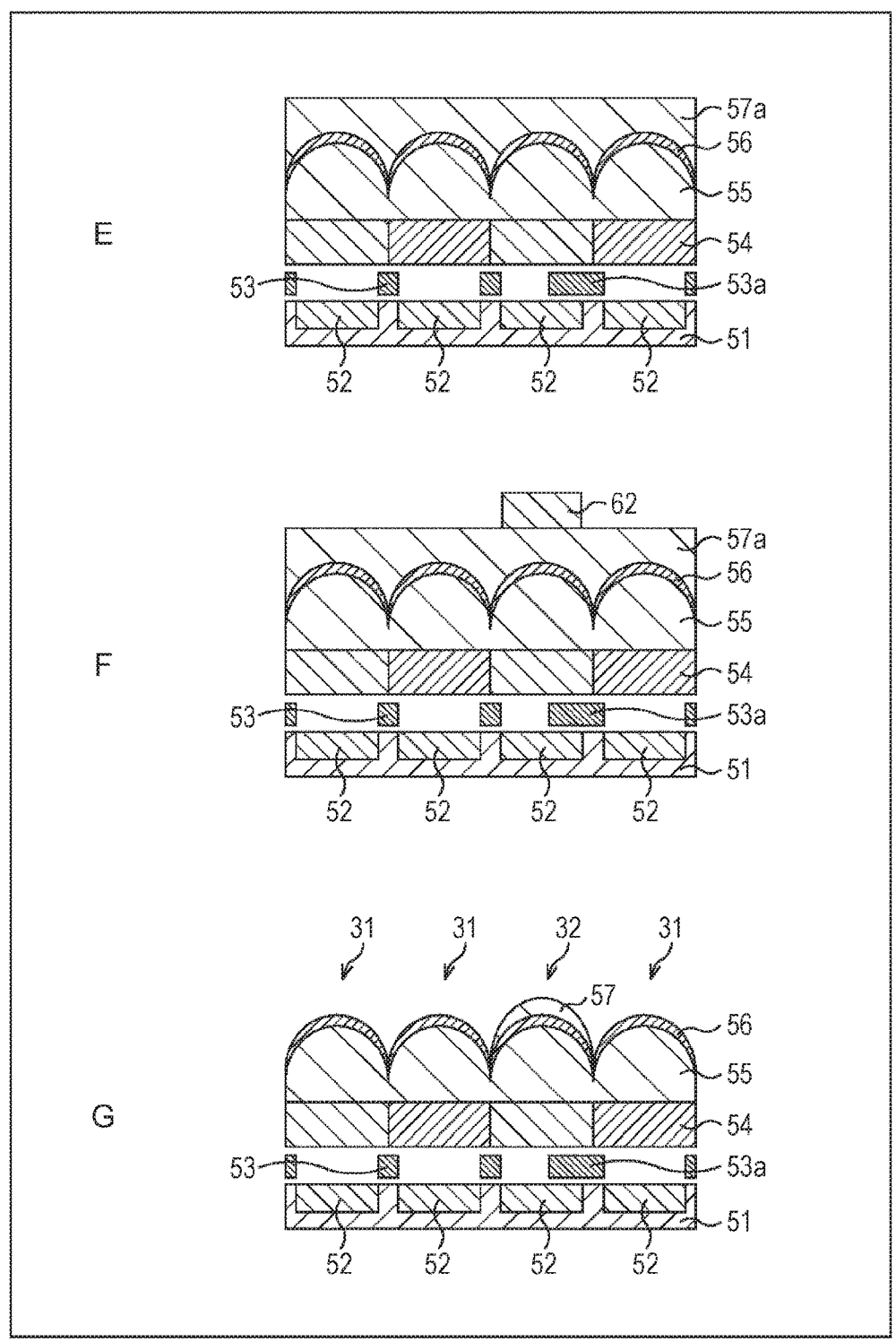
FIG. 6 is a diagram for explaining the steps in pixel formation.

Referring now to FIGS. 4 through 6, the flow of pixel formation according to this embodiment is described. FIG. 4 is a flowchart for explaining a pixel forming process. FIGS. 5 and 6 are cross-sectional views showing the steps in the pixel formation.

In the description below, the process after the color filter layers 54 are formed is described.

In step S11, as shown in A in FIG. 5, a lens material 55a such as a styrene-acrylic copolymer is formed as a film on the color filter layers 54.

In step S12, as shown in B in FIG. 5, a resist pattern 61 for each pixel is formed on the lens material 55a by a photolithography method.

In step S13, the resist patterns 61 are transferred onto the lens material 55a by etching, so that dry etching is performed. As a result, a microlens 55 is formed for each pixel, as shown in C in FIG. 5.

In step S14, as shown in D in FIG. 5, a film (an etching stopper film) 56 made of SiO, SiN, SiON, or the like is formed on the microlenses 55 formed on the respective pixels, so as to cover the surfaces of the microlenses 55.

In step S15, as shown in E in FIG. 6, a lens material 57a such as a styrene-acrylic copolymer is formed as a film on the film 56.

In step S16, as shown in F in FIG. 6, a resist pattern 62 only for the focus detecting pixel is formed on the lens material 57a by a photolithography method.

In step S17, the resist patterns 62 is transferred onto the lens material 57a by etching, so that dry etching is performed. As a result, a microlens 57 is formed as shown in G in FIG. 6.

In this manner, the imaging pixels 31 and the focus detecting pixel 32 are formed.

In the process described above, through the lithographic process at the time of the formation of the microlenses, the shapes of the microlenses 55 do not vary between the imaging pixels 31 adjacent to the focus detecting pixel 32 and the imaging pixels 31 not adjacent to the focus detecting pixel 32, and all the pixels do not become taller. While the light collecting points are set on the light receiving surfaces of the photoelectric conversion units 52 in the imaging pixels 31, the light collecting point is set on the upper surface of the light shielding film 53a in the focus detecting pixel 32. That is, while the AF properties of the focus detecting pixel are maintained, the sensitivity of the imaging pixels can be improved without any degradation in color mixing.

Pixel Arrangement of a Second Embodiment

Figure 7:
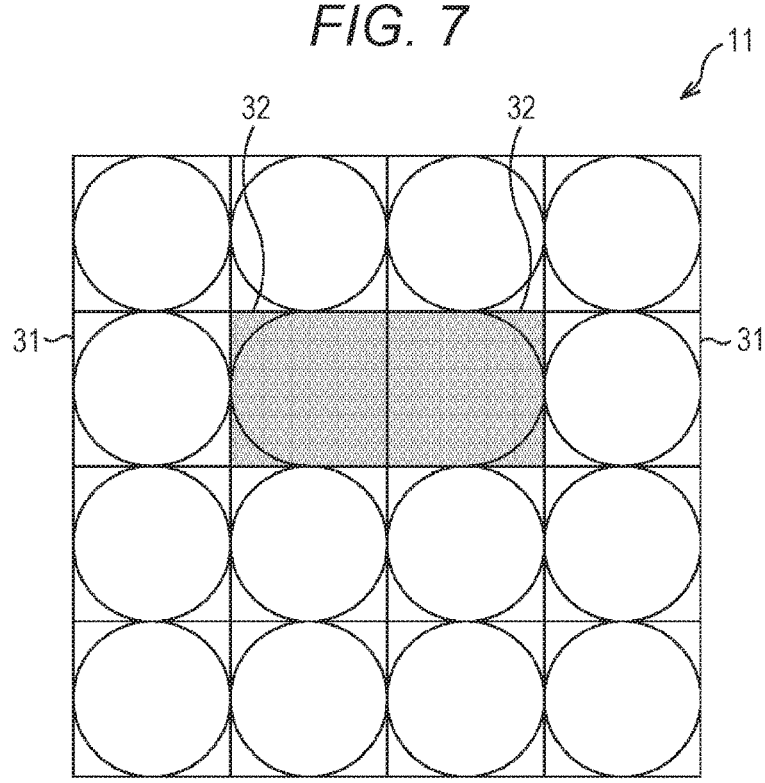
FIG. 7 is a diagram for explaining the pixel arrangement in a second embodiment of the present technology.

Referring now to FIG. 7, the pixel arrangement in a pixel array unit 11 of a second embodiment is described.

The pixel array unit 11 shown in FIG. 7 is the same as the pixel array unit 11 of FIG. 2 in that focus detecting pixels 32 represented by gray squares are scattered among imaging pixels 31 two-dimensionally arranged in a matrix fashion, but differs from the pixel array unit 11 of FIG. 2 in that two (a pair of) focus detecting pixels 32 are adjacent to each other.

As will be described later, in this embodiment, the microlens on the film 56 of the focus detecting pixels 32 is formed so as to be shared between the two focus detecting pixels 32 adjacent to each other.

Example Configuration of Pixels of the Second Embodiment

Figure 8:
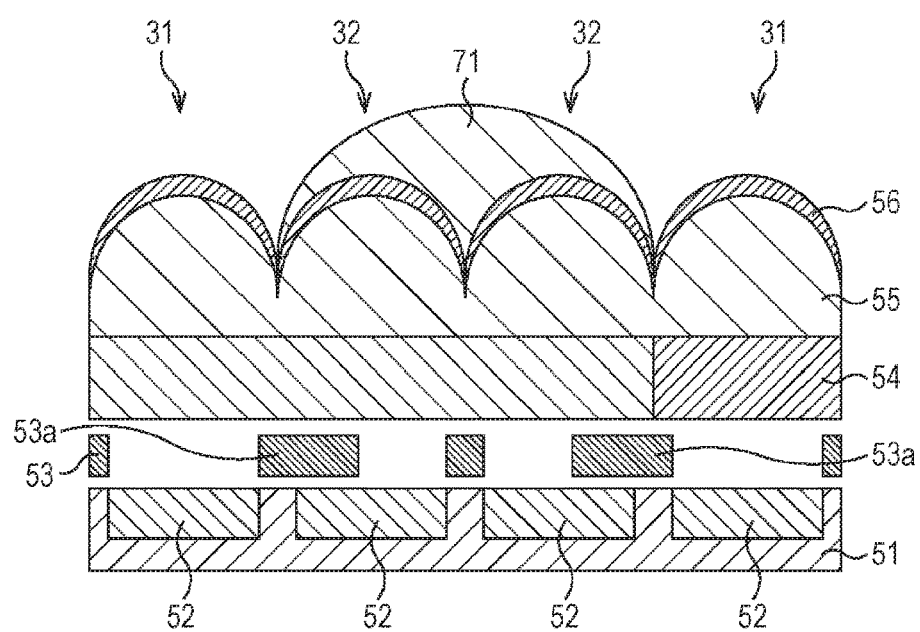
FIG. 8 is a cross-sectional view of an example configuration of pixels according to the second embodiment of the present technology.

FIG. 8 is a cross-sectional view of an example configuration of the pixels in the CMOS image sensor 10 of the second embodiment.

The components formed in the same manner between the imaging pixels 31 and the focus detecting pixels 32 shown in FIG. 8 and the imaging pixels 31 and the focus detecting pixel 32 shown in FIG. 3 will not be described below.

As shown in FIG. 8, in the two focus detecting pixels 32 that are adjacent to each other and form a pair, a light shielding film 53a is formed to form openings on different sides of the light receiving regions of the respective photoelectric conversion units 52.

Also, on the film 56 of the two focus detecting pixels 32, a microlens 71 is formed so as to be shared between the two focus detecting pixels 32 adjacent to each other.

In the imaging pixels 31 and the focus detecting pixels 32 in this embodiment, the microlenses 55 are also uniformly formed or are formed to have identical shapes and sizes, and have the same light collecting points. In the focus detecting pixels 32, however, the shape and the thickness of the microlens 71 are adjusted so as to precisely set a light collecting point.

That is, in the imaging pixels 31, the light collecting points can be set on the light receiving surfaces of the photoelectric conversion units 52 by the microlenses 55. In the focus detecting pixels 32, the light collecting point can be set on the upper surface of the light shielding film 53a by the microlenses 55 and 71.

In the configuration according to this embodiment, through the lithographic process at the time of the formation of the microlenses, the shapes of the microlenses 55 do not vary between the imaging pixels 31 adjacent to the focus detecting pixel 32 and the imaging pixels 31 not adjacent to the focus detecting pixel 32, and all the pixels do not become taller. While the light collecting points are set on the light receiving surfaces of the photoelectric conversion units 52 in the imaging pixels 31, the light collecting point is set on the upper surface of the light shielding film 53a in the focus detecting pixel 32. That is, while the AF properties of the focus detecting pixel are maintained, the sensitivity of the imaging pixels can be improved without any degradation in color mixing.

There is a conventional configuration in which a single microlens that is in the same layer and has the same thickness as the microlenses of the imaging pixels is shared between adjacent focus detecting pixels. In such a configuration, however, the light focusing efficiency becomes lower, and incident light with a sufficiently high light intensity is not obtained. Therefore, segregation characteristics indicating the pixel outputs of the respective focus detecting pixels with respect to the incidence angle of the incident light might be degraded.

In this embodiment, on the other hand, the microlens to be shared between the focus detecting pixels is further formed on the microlenses formed for the respective focus detecting pixels forming a pair. Accordingly, the light focusing efficiency becomes higher, and incident light with a sufficiently high light intensity is obtained. Thus, segregation characteristics can be improved.

It should be noted that the flow of the pixel formation according to this embodiment is basically the same as the flow of the pixel formation described above with reference to FIGS. 4 through 6, except for the shape of the resist pattern formed at the time of the formation of the microlens 71. Therefore, the flow of the pixel formation according to this embodiment is not explained herein.

Example Configuration of Pixels of a Third Embodiment

Figure 9:
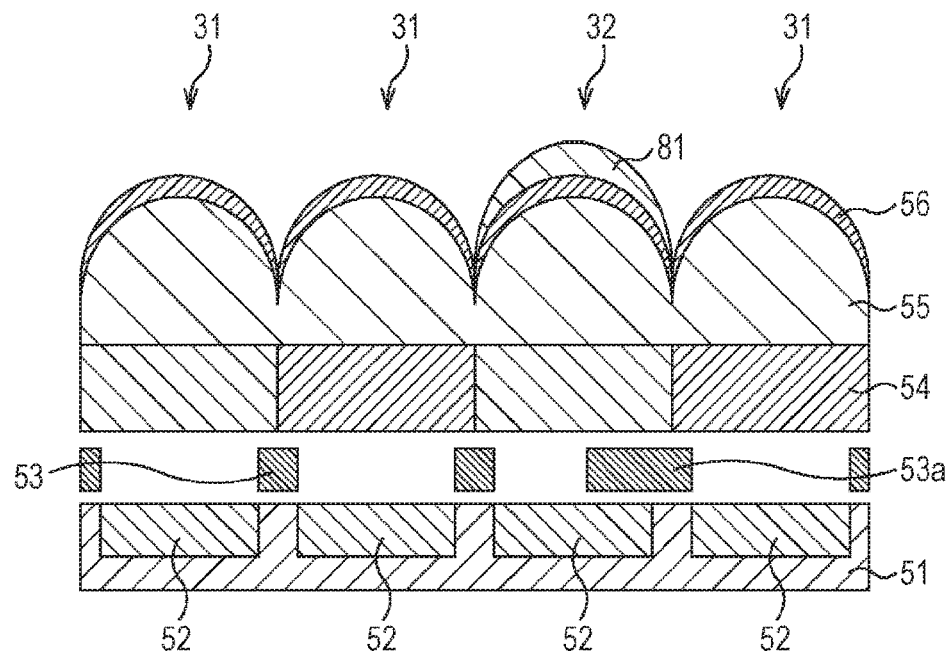
FIG. 9 is a cross-sectional view of an example configuration of pixels according to a third embodiment of the present technology.

Referring now to FIG. 9, an example configuration of pixels of a third embodiment is described.

The components formed in the same manner between the imaging pixels 31 and the focus detecting pixel 32 shown in FIG. 9 and the imaging pixels 31 and the focus detecting pixel 32 shown in FIG. 3 will not be described below.

The configuration shown in FIG. 9 differs from the configuration shown in FIG. 3 in that a microlens 81 is formed in place of the microlens 57 on the film 56 of the focus detecting pixel 32.

The microlens 81 has a higher refractive index than the refractive index of the microlenses 55. For example, the refractive index of the microlens 81 is approximately 2.0, for example.

As described above, in the focus detecting pixel 32, the refractive index of the microlens 81 is a higher refractive index than the refractive index of the microlenses 55, so that the same functions and effects as those of the configuration shown in FIG. 3 can be achieved. Furthermore, the light focusing efficiency in the focus detecting pixel 32 becomes higher, and occurrences of color mixing in the imaging pixels 31 adjacent to the focus detecting pixel 32 can be reduced more certainly. Thus, sensitivity degradation can be prevented.

Figure 10:
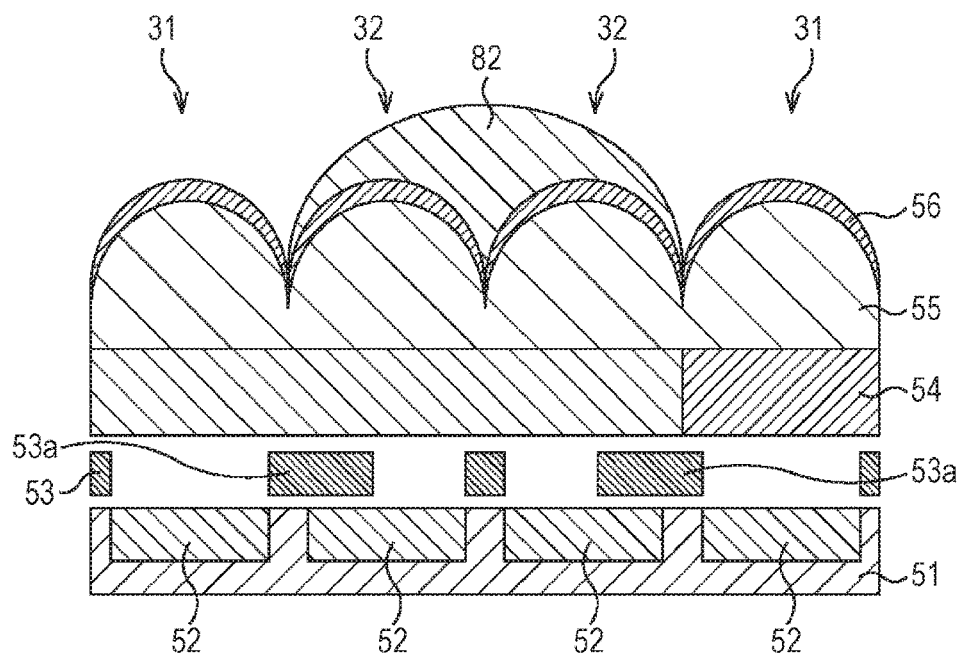
FIG. 10 is a cross-sectional view of another example configuration of pixels according to the third embodiment of the present technology.

FIG. 10 is a diagram showing another example configuration of pixels according to the third embodiment.

The components formed in the same manner between the imaging pixels 31 and the focus detecting pixels 32 shown in FIG. 10 and the imaging pixels 31 and the focus detecting pixels 32 shown in FIG. 8 will not be described below.

The configuration shown in FIG. 10 differs from the configuration shown in FIG. 8 in that a microlens 82 is formed in place of the microlens 71 on the film 56 of two focus detecting pixel 32 adjacent to each other.

The microlens 82 has a higher refractive index than the refractive index of the microlenses 55. For example, the refractive index of the microlens 82 is approximately 2.0, for example.

As described above, in the pair of focus detecting pixels 32, the refractive index of the microlens 81 is a higher refractive index than the refractive index of the microlenses 55, so that the same functions and effects as those of the configuration shown in FIG. 8 can be achieved. Furthermore, the light focusing efficiency in the focus detecting pixel 32 becomes higher, and occurrences of color mixing in the imaging pixels 31 adjacent to the focus detecting pixel 32 can be reduced more certainly. Thus, sensitivity degradation can be prevented.

Pixel Arrangement of a Fourth Embodiment

Figure 11:
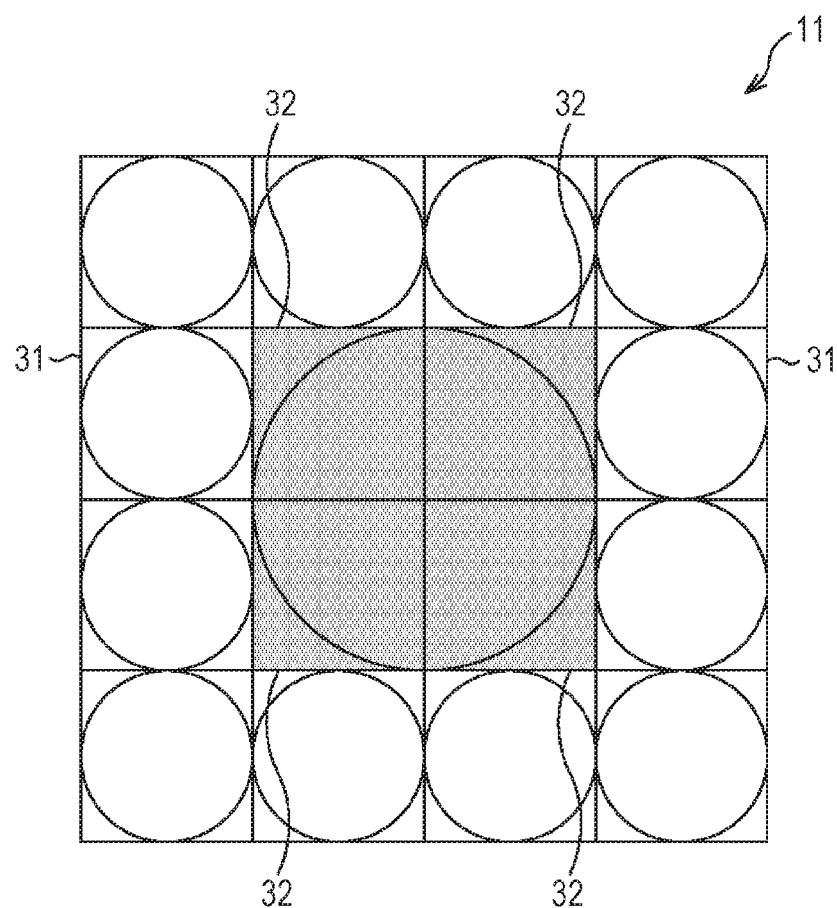
FIG. 11 is a diagram for explaining the pixel arrangement in a fourth embodiment of the present technology.

Referring now to FIG. 11, the pixel arrangement in a pixel array unit 11 of a fourth embodiment is described.

The pixel array unit 11 shown in FIG. 11 is the same as the pixel array unit 11 of FIG. 2 in that focus detecting pixels 32 represented by gray squares are scattered among imaging pixels 31 two-dimensionally arranged in a matrix fashion, but differs from the pixel array unit 11 of FIG. 2 in that four focus detecting pixels 32 are adjacent to one another.

In this embodiment, the microlens on the film 56 of the focus detecting pixels 32 is formed so as to be shared between the four focus detecting pixels 32 adjacent to one another.

With such a configuration, the same functions and effects as those of the above described configuration can be achieved.

<Example Structure of an Electronic Apparatus>

Figure 12:
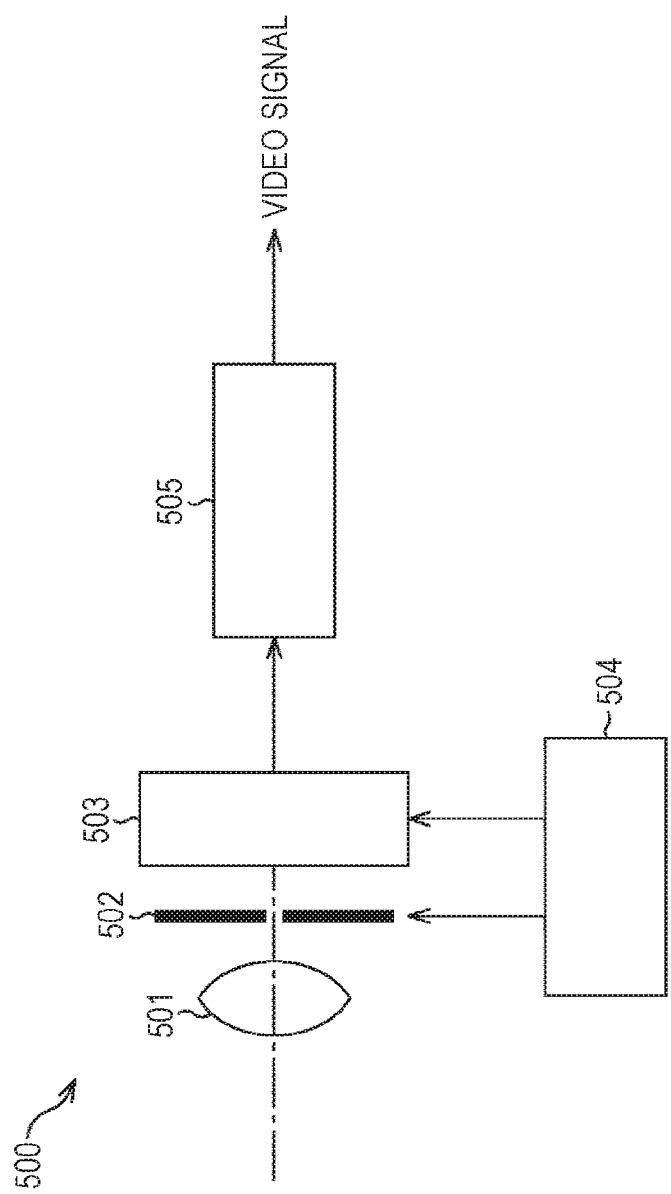
FIG. 12 is a block diagram showing an example structure of an electronic apparatus to which the present technology is applied.

Referring to FIG. 12, an example structure of an electronic apparatus to which the present technology is applied is described.

The electronic apparatus 500 shown in FIG. 12 includes an optical lens 501, a shutter device 502, a solid-state imaging device 503, a drive circuit 504, and a signal processing circuit 505. FIG. 12 shows the structure of an electronic apparatus (a digital still camera, for example) in which a CMOS image sensor 10 having pixels of one of the embodiments described above is provided as the solid-state imaging device 503.

The optical lens 501 gathers image light (incident light) from an object and forms an image on the imaging surface of the solid-state imaging device 503. With this, signal charges are stored in the solid-state imaging device 503 for a certain period of time. The shutter device 502 controls the light exposure period and the light shielding period for the solid-state imaging device 503.

The drive circuit 504 supplies drive signals for controlling signal transfer operation of the solid-state imaging device 503 and shutter operation of the shutter device 502. In accordance with a drive signal (a timing signal) supplied from the drive circuit 504, the solid-state imaging device 503 performs signal transfer. The signal processing circuit 505 performs various kinds of signal processing on signals output from the solid-state imaging device 503. Video signals subjected to the signal processing are stored into a storage medium such as a memory, or are output to a monitor.

The electronic apparatus 500 further includes a lens drive unit (not shown) that drives the optical lens 501 in the direction of its optical axis. The lens drive unit, in conjunction with the optical lens 501, forms a focusing mechanism that adjusts the focal point. In the electronic apparatus 500, a system controller that is not shown in the drawing controls the focusing mechanism, the respective components described above, and the like.

As for the control on the focusing mechanism, the signal processing circuit 505, for example, performs a calculation process to calculate a shift direction and a shift amount of the focal point based on a focal detection signal output from the focus detecting pixel(s) in a solid-state imaging device of the present technology. Receiving a result of this calculation, the system controller performs focus control by moving the optical lens 501 in the direction of its optical axis via the lens drive unit, so as to achieve a focal point (focus).

In the solid-state imaging device 503 of the electronic apparatus 500 according to an embodiment of the present technology, the sensitivity of the imaging pixels can be improved while the AF properties of the focus detecting pixel(s) are maintained. As a result, higher image quality can be achieved.

It should be noted that embodiments of the present technology are not limited to the above described embodiments, and various modifications may be made to them without departing from the scope of the present technology.

Further, the present technology may also be embodied in the structures described below.

(1)
A solid-state imaging device including:
a pixel array unit including a plurality of pixels;
first microlenses formed in the respective pixels;
a film formed to cover the first microlenses of the respective pixels; and
a second microlens formed on the film of a focus detecting pixel among the pixels.

(2)
The solid-state imaging device of (1), wherein the film is formed as an etching stopper film that prevents etching on the first microlenses of the pixels other than the focus detecting pixel when the second microlens is formed.

(3)
The solid-state imaging device of (1) or (2), wherein the film has a refractive index of approximately 1.4 to 2.0.

(4)
The solid-state imaging device of any of (1) through (3), wherein the film is formed with SiO, SiN, or SiON.

(5)
The solid-state imaging device of any of (1) through (4), wherein the second microlens is formed so as to be shared by a plurality of focus detecting pixels adjacent to each other.

(6)
The solid-state imaging device of any of (1) through (5), wherein the second microlens has a higher refractive index than a refractive index of the first microlenses.

(7)
The solid-state imaging device of any of (1) through (6), wherein the first microlenses of the respective pixels are formed in the same layer.

(8)
A method of manufacturing a solid-state imaging device including a pixel array unit having a plurality of pixels,
the method including:
forming first microlenses in the respective pixels;
forming a film to cover the first microlenses of the respective pixels; and
forming a second microlens on the film of a focus detecting pixel among the pixels.

(9)
An electronic apparatus including
a solid-state imaging device including:
a pixel array unit including a plurality of pixels;
first microlenses formed in the respective pixels;
a film formed to cover the first microlenses of the respective pixels; and
a second microlens formed on the film of a focus detecting pixel among the pixels.

REFERENCE SIGNS LIST

10 CMOS image sensor
11 Pixel array unit
31 Imaging pixel
32 Focus detecting pixel
51 Semiconductor substrate
52 Photoelectric conversion unit
53*a* Light shielding film
55 Microlens
56 Film
57 Microlens
71 Microlens
81 Microlens
82 Microlens
500 Electronic apparatus
503 Solid-state imaging device

What is claimed is:

1. A solid-state imaging device comprising:
   a pixel array unit including a plurality of imaging pixels and a focus detecting pixel;
   a plurality of photoelectric conversion units, wherein each imaging pixel in the plurality of imaging pixels and the focus detecting pixel includes at least one of the photoelectric conversion units;
   a plurality of first microlenses, wherein each imaging pixel in the plurality of imaging pixels and the focus detecting pixel includes one first microlens included in the plurality of first microlenses;
   a film covering each microlens in the plurality of first microlenses; and
   a second microlens formed directly on the film, wherein the focus detecting pixel includes at least a portion of the second microlens, wherein at least a portion of one first microlens included in the plurality of first microlenses is between at least a portion of the second microlens and the at least one photoelectric conversion unit of the focus detecting pixel, wherein no imaging pixel in the plurality of imaging pixels includes the second microlens, and wherein a surface of the film on which the second microlens is directly formed is non-planar.

2. The solid-state imaging device according to claim 1, wherein the film is formed as an etching stopper film configured to prevent etching on the plurality of first microlenses of the pixels other than the focus detecting pixel when the second microlens is formed.

3. The solid-state imaging device according to claim 1, wherein the film has a refractive index of approximately 1.4 to 2.0.

4. The solid-state imaging device according to claim 3, wherein the second microlens has a higher refractive index than a refractive index of the plurality of first microlenses.

5. The solid-state imaging device according to claim 3, wherein the plurality of first microlenses of the pixels are formed in the same layer.

6. The solid-state imaging device according to claim 1, wherein the film is formed with one of SiO, SiN, and SiON.

7. The solid-state imaging device according to claim 1, wherein the second microlens is formed so as to be shared by a plurality of the focus detecting pixels adjacent to each other.

8. The solid-state imaging device according to claim 1, wherein the second microlens has a higher refractive index than a refractive index of the plurality of first microlenses.

9. The solid-state imaging device according to claim 1, wherein the plurality of first microlenses of the pixels are formed in the same layer.

10. The solid-state imaging device according to claim 1, further comprising a plurality of focus detecting pixels and a plurality of second microlenses, wherein each of the focus detecting pixels includes at least a portion of one of the second microlenses.

11. The solid-state imaging device according to claim 1, wherein the focus detecting pixel further includes a light shielding film.

12. The solid-state imaging device according to claim 11, wherein a light collecting point for the focus detecting pixel is on an upper surface of the light shielding film.

13. The solid-state imaging device according to claim 12, wherein the light collecting point for each of the imaging pixels is on a light receiving surface of a photoelectric conversion unit.

14. The solid-state imaging device according to claim 11, wherein the second microlens has a higher refractive index than a refractive index of the first microlenses.

15. The solid-state imaging device according to claim 11, wherein the plurality of first microlenses of the pixels are formed in the same layer.

16. An electronic apparatus comprising:
a solid-state imaging device including:
 a pixel array unit including a plurality of imaging pixels and a plurality of focus detecting pixels;
 a plurality of photoelectric conversion units, wherein each of the imaging pixels and each of the focus detecting pixels includes at least one of the photoelectric conversion units;
 a plurality of first microlenses, wherein each of the imaging pixels and each of the focus detecting pixels includes a first microlens;
 a film covering the plurality of first microlenses; and
 a plurality of second microlenses formed directly on the film, wherein each of the focus detecting pixels includes at least a portion of one of the plurality of second microlenses, wherein at least a portion of a first one of the plurality of first microlenses is between at least a portion of a first one of the plurality of second microlenses and the at least one of the photoelectric conversion units of a first one of the focus detecting pixels, wherein the plurality of second microlenses are not included in any of the imaging pixels, and wherein a surface of the film covering the first microlenses on which the plurality of second microlenses are directly formed is non-planar.

17. The electronic apparatus of claim 16, wherein each of the plurality of focus detecting pixels further includes a light shielding film.

18. The electronic apparatus of claim 17, wherein a light collecting point for each of the plurality of focus detecting pixels is on an upper surface of the light shielding film.

19. The electronic apparatus of claim 18, wherein the light collecting point for each of the imaging pixels is on a light receiving surface of a photoelectric conversion unit.

* * * * *